United States Patent Office 3,477,887
Patented Nov. 11, 1969

3,477,887

GASEOUS DIFFUSION METHOD

Gary G. Ehlenberger, Phoenix, Ariz., assignor to Motorola, Inc., Franklin Park, Ill., a corporation of Illinois No Drawing. Filed July 1, 1966, Ser. No. 562,074
Int. Cl. H01l 7/44
U.S. Cl. 148—189 8 Claims

ABSTRACT OF THE DISCLOSURE

In the fabrication of a semiconductor device, conductivity type-determining impurities are diffused into a monocrystalline semiconductor element by a series of steps including the formation of a gaseous mixture comprising a dopant source compound and a separate gaseous mixture comprising oxygen. The dopant source-comprising stream and the oxygen-comprising stream are separately passed to an oxidation zone maintained at a temperature of 800° to 1400° C. in order to form a wholly gas phase reaction product containing the dopant oxide. The reaction product mixture is then passed from the oxidation zone to a diffusion zone wherein the semiconductor crystal element is maintained at a temperature of about 800° to 1300° C.

This invention relates to the fabrication of semiconductor devices and more particularly to an improved method of diffusing a dopant into a semiconductor crystal element.

In fabricating a semiconductor device, it is common to alter the conductivity or resistivity of selected regions of a semiconductor crystal element by diffusing a dopant into the element. Generally, the semiconductor crystal element is placed in a quartz tube inserted in a furnace capable of heating the semiconductor crystal element to an elevated temperature for the diffusion. A gaseous mixture including the dopant to be diffused into the crystal element is passed through the tube over the element. As the dopant passes over the element, the exposed surfaces and underlying regions are doped.

Previously, it was difficult to obtain diffused regions of uniform doping in a single diffusion step because of the lack of control of the amount of dopant introduced into the diffusion chamber. Additionally, the concentration of dopant varied widely from one location to another within the tube. Quantities of dopant far in excess of the actual requirement were utilized with the result that it was common for solid and liquid deposits of the impurity to form on the walls of the tube and subsequently deposit on the crystal element, yielding very highly doped regions. Therefore, it was considered important to clean the quartz tube after each diffusion run.

An object of the invention is to provide a method of diffusing a dopant into a semiconductor crystal element, which method substantially minimizes the deposition of dopant on the walls of the diffusion chamber.

A further object of the invention is to provide a method of diffusing a dopant into a semiconductor crystal element from a gaseous mixture with improved control of the distribution of the dopant onto and into the crystal element.

A feature of the invention is the reaction of a source of a dopant with oxygen at a sufficiently high temperature to form and retain the reaction products in a gaseous state both prior to and during passage of the reaction products over a semiconductor crystal element to achieve uniform distribution of the dopant therein.

The invention is embodied in a method of diffusing a dopant into a semiconductor crystal element which includes forming a gaseous mixture comprising a gaseous diluent and a source of a dopant to be diffused into a semiconductor crystal element. This gaseous mixture is reacted with oxygen at a temperature between about 800° and 1400° C. and the products of the reaction passed over the crystal element at a temperature between about 800° and 1300° C.

A semiconductor crystal element treated in accordance with the present invention is advantageously single crystal silicon and generally is in the form of a wafer which is typically obtained from a larger crystal grown by known crystal pulling or melting processes. The larger crystal is sliced into wafers and the wafers lapped, polished and otherwise processed to make their major faces substantially parallel to each other. The diameter of the wafer may be of any value and the thickness is usually within a practical range; e.g., between about 4 and 40 mils.

The wafer will generally have an oxide masking layer formed on its surfaces by one of the known thermal or deposition processes. This oxide, which is usually between about 500 and 10,000 Angstroms thick, protects the wafer from surface damage and masks portions thereof to limit the diffusion of dopants to preselected areas of the wafer. The masking of the wafer is accomplished using photoresist and etching techniques to remove the oxide from the areas into which the impurity is to be diffused.

The method of the invention is particularly useful with oxides of dopants having relatively high melting points, generally in excess of 450° C., which are not readily vaporized. Oxides, such as $B_2O_3$ with a melting point of about 580° C. and $Sb_2O_3$ with a melting point of about 650° C., are examples of preferred dopants that are difficult to vaporize and maintain in a gaseous state.

To obtain the oxide, a source compound of the dopant that is readily oxidizable at an elevated temperature is selected. This source compound may be in the form of a solid, liquid or gas. Preferably compounds such as a halide of boron or antimony, diborane, organic compounds of boron or antimony that may be readily oxidized, such as a borate, an alky/antimony, etc. are utilized.

The gaseous diluent employed is inert to the semiconductor material at the processing temperatures; e.g., above about 800° C. The diluent preferably is nitrogen but also may be helium, argon, etc.

The dopant compound to be oxidized is employed as a gaseous mixture formed by passing a small amount of the gaseous diluent over or through the source or bleeding off a small amount of the dopant compound if it is a gas into the gaseous diluent to form the dopant source stream. The amount of dopant in the dopant source stream is partially dependent upon the temperature of the source. This temperature is generally between about 0° and 27° C., although higher temperatures may be necessary to achieve effective dopant concentrations. In conjunction with the temperature of the source, the flow rate of the gaseous diluent determines the ultimate quantity of dopant compound utilized if it is a solid or liquid. A low flow rate between about five and eight cubic centimeters per minute is preferred for most diffusions.

This dopant source stream is combined with another stream of gaseous diluent having a much higher flow rate so that the concentration of the dopant is substantially reduced in the resultant dilute dopant source stream. The flow rate of the dilute dopant stream is such that the dopant source stream has a negligible effect upon the total flow. The flow rate of the dilute dopant source stream is partially dependent on other streams in the system. Satisfactory dilution is obtained with a flow rate between about 100 and 1,000 cubic centimeters per minute based on a tube diameter of about 50 mm.

Oxygen, to react with the dopant source compound to form the dopant oxide, is supplied from an independent stream. A sufficient quantity is employed to oxidize the dopant and, if desired, to oxidize the exposed surface of the crystal element during the diffusion. An oxygen flow rate between about 10 and 100 cubic centimeters per minute is generally sufficient for normal amounts of the dopant source to effect favorable reaction conditions. The oxygen is combined with a stream of gaseous diluent having a much higher flow rate. The flow rate of this stream to be combined with the oxygen is usually between about 100 and 1,000 cubic centimeters per minute. The combined flow rates of the dilute dopant source stream and oxygen stream is preferably between about 200 and 2,000 cubic centimeters per minute, permitting a coordinated adjustment of the flow of the two streams.

The dopant oxide is formed by reacting the two streams, the dilute dopant and the oxygen, at an elevated temperature. The temperature for this reaction should be substantially above the melting point of the resultant oxide to insure the sustaining of an all-vapor phase system. A temperature between about 800° and 1400° C. causes the oxidation to occur at a suitable rate and maintains the reaction products in a gaseous state.

Preferably, the two separate streams, dilute dopant source and oxygen, are intermingled and reacted substantially simultaneously at the elevated temperature immediately prior to passage of the gas stream into the diffusion chamber. The reaction products flow, as a single stream, into the diffusion chamber and pass over and about the heated semiconductor crystal elements to dope them. The close proximity of the reaction to the diffusion chamber facilitates the maintenance of proper conditions for the reaction and the diffusion.

The temperature of the diffusion chamber is similar to that at which the reaction occurs and preferably between about 800° and 1300° C., so that the diffusion occurs at a desirable rate, and the gaseous state of the reaction products is maintained. An even dispersion of the oxide is achieved in the diffusion chamber by the high flow of the gas therethrough. The resulting doping of the surfaces and the diffusion into the wafers are correspondingly uniform.

The following examples illustrates specific embodiments of the invention, although it is not intended that the examples in any way restrict the scope of the invention.

EXAMPLE I

Silicon wafers about 1½" in diameter and 8 mils thick were heated in an oxidizing atmosphere to form an oxide layer about 5,000 Angstroms thick. The oxide was treated with commercial photosensitive etch resistant material and etching solutions to form a pattern thereon exposing preselected regions of the silicon wafer. These wafers were positioned with the polished surfaces facing each other vertically in a quartz ladder boat. The ladder boat containing the wafers was placed in a quartz diffusion tube that had previously been inserted into a furnace capable of providing temperatures suitable for effective diffusion.

The tube was provided with a cap end fitting such that the wafers could be inserted after the tube was positioned in the furnace. After the insertion of the wafers, the cap was replaced and connected to an exhaust for the tube. The opposite end of the tube was provided with lines for the various gases utilized in the doping process.

The wafers were given a three minute warm-up in a zone of the furnace at a temperature of about 888±1° C. The gaseous diluent utilized in this example was nitrogen. During the warm-up period two nitrogen streams, one including oxygen, two streams of gas, a first of nitrogen and a second comprising nitrogen and oxygen flowing at a combined rate of about 800 cubic centimeters per minute, were passed over the wafers. The oxygen comprised about 2% by volume of the mixture.

At the termination of the warm-up, the dopant source stream was initiated. The dopant source stream was formed by bubbling nitrogen at a flow rate of about 5 cubic centimeters per minute through liquid $BBr_3$ at a temperature of about 0° C. and combining the mixture with the first nitrogen stream having flow rate of about 400 cubic centimeters per minute. This stream then was mixed with the oxygen-nitrogen stream in a reaction chamber at a temperature of about 850° C. The reaction chamber was a portion of the tube located in the hot zone of the furnace ahead of the boat holding the wafers. This chamber was provided with inlets for the gaseous streams and an outlet into the diffusion chamber for the reaction products.

The reaction products were swept into the diffusion chamber by the stream of mixed gases flowing at about 800 cubic centimeters per minute, and over the wafers positioned therein that were maintained at a temperature of about 1100° C. The gases after passing over the wafers were vented from the tube. The flow of gases including the reaction products was maintained for about three minutes. The first stream of nitrogen and the second stream comprising nitrogen and oxygen were maintained for an additional three minutes, and then the wafers were removed from the tube.

The wafers were examined visually and bevelled and stained according to conventional procedures to determine the depth and characteristic of the diffusion. The dopant had diffused uniformly into the wafers about 0.1 micron, and no spots of excessively high doping were found. A glass about 100 Angstroms thick had grown on the exposed surfaces of the silicon wafers during the diffusion. The doped regions of the wafers had a sheet resistivity of about 300 ohms per square and a surface concentration approaching solid solubility of about $1.2 \times 10^{20}$ atoms per cubic centimeter.

EXAMPLE II

The procedure of this example was the same as that of Example I except that the dopant source stream was formed by passing nitrogen at about 5 cubic centimeters per minute over solid $BI_3$ which was maintained at 27° C.

The same beneficial properties were observed for this diffusion as for Example I.

EXAMPLE III

The procedure of this example was the same as that of Example I except that the dopant source stream was formed by passing nitrogen at about 5 cubic centimeters per minute through liquid $SbCl_5$ at a temperature of 27° C. The flow of the dopant source stream was maintained for about 30 minutes.

The wafers were examined as in Example I. The dopant had diffused uniformly into the wafers to a depth of about 0.1 micron. The surface concentration of the dopant approached the solid solubility of about $5 \times 10^{19}$ atoms per cubic centimeter.

EXAMPLE IV

The procedure of this example was the same as that of Example III except that the dopant source stream was formed by bubbling nitrogen at about 5 cubic centimeters per minute through liquid $SbBr_3$ at a temperature of about 142° C. At this temperature the source compound has an advantageous vapor pressure of about 10 millimeters of mercury.

The resulting diffusion had the same beneficial characteristics as in Example III.

EXAMPLE V

The procedure of this example was the same as that of Example I except that the flow of the dopant source stream was maintained for about 30 minutes.

The wafers were examined as in Example I. The dopant had diffused into the wafers about 1.6 microns. A sheet resistivity of 7 ohms per square was observed.

In all the examples there was no evidence of deposits of the dopant forming on the walls of the quartz tube.

The above description and examples show that the present invention provides a novel method of performing a diffusion into a semiconductor crystal element so as to substantially minimize the deposition of dopant on the walls of the diffusion chamber. Moreover, with the method of the invention improved control is possible of the distribution of the dopant onto and into the crystal element.

What is claimed is:

1. A method of diffusing a dopant into a semi-conductor crystal element which comprises:

(a) forming a gaseous mixture comprising a gaseous diluent and a source of dopant to be diffused into said semi-conductor element;

(b) forming a separate gaseous mixture of oxygen and a diluent;

(c) separately passing said dopant source-comprising stream and said oxygen-comprising stream to an oxidation zone maintained at a temperature of 800° to 1400° C. to form a mixture of reaction products consisting wholly of gas phase components, including the dopant oxide; then (d) while maintaining said gaseous reaction product mixture in the gaseous phase, passing said gaseous reaction product mixture from said reaction zone to a diffusion zone wherein said semiconductor crystal element is maintained at a temperature between about 800° and 1300° C.

2. A method according to claim 1 in which said oxygen is a portion of a second gaseous mixture in which a gaseous diluent is a major constituent.

3. A method according to claim 1 in which said products of said reaction include an oxide of said dopant, said oxide having a melting point between about 450° and 800° C.

4. A method according to claim 1 in which said dopant source is selected from the group consisting of boron and antimony compounds.

5. A method according to claim 1 in which said dopant source comprises a boron compound.

6. A method according to claim 1 in which said dopant source comprises an antimony compound.

7. A method according to claim 1 in which said reaction temperature is between about 800° and 1000° C.

8. A method according to claim 1 in which said gaseous diluent comprises a major portion of said gaseous mixtures and of said reaction products.

References Cited

UNITED STATES PATENTS

| | | | |
|---|---|---|---|
| 2,802,760 | 8/1957 | Derick et al. | 148—189 X |
| 2,804,405 | 8/1957 | Derick et al. | 148—189 X |
| 2,873,222 | 2/1959 | Derick et al. | 148—189 X |
| 3,066,052 | 11/1962 | Howard. | |
| 3,164,501 | 1/1965 | Beale et al. | 148—189 |
| 3,228,812 | 1/1966 | Blake | 148—187 |
| 3,244,567 | 4/1966 | Crishal et al. | 148—189 |

L. DEWAYNE RUTLEDGE, Primary Examiner

R. A. LESTER, Assistant Examiner

U.S. Cl. X.R.

148—186, 187, 188